(12) United States Patent  (10) Patent No.: US 6,234,813 B1
Hanyu  (45) Date of Patent: May 22, 2001

(54) EJECTION MECHANISM IN A CARD CONNECTOR

(75) Inventor: Takuji Hanyu, Tokyo (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/393,716

(22) Filed: Sep. 10, 1999

(30) Foreign Application Priority Data

Sep. 25, 1998 (JP) .................................. 10-288861

(51) Int. Cl.[7] .................................................. H01R 13/62
(52) U.S. Cl. ............................................................ 439/159
(58) Field of Search ................................... 439/159, 160, 439/152, 153–155

(56) References Cited

U.S. PATENT DOCUMENTS 5,791,920 * 8/1998 Tomioka et al. ...................... 439/159
5,921,792 * 7/1999 Chen ..................................... 439/160
5,989,045 * 11/1999 Kimura ................................. 439/159
6,017,230 * 1/2000 Yao ...................................... 439/159

* cited by examiner

Primary Examiner—Hien Vu
(74) Attorney, Agent, or Firm—Stacey E. Caldwell

(57) ABSTRACT

Disclosed is a card ejection mechanism comprising: a metal shell having a guide section on one side thereof; an ejection rod slidably movable within the guide section; and an ejection lever rotatable with respect to the inner surface of the metal shell and operatively connected to the ejection rod that the ejection lever rotates during actuation of the ejection rod. Ejection rod is a rectangular metal piece stamped out of a metal sheet. Guide section is composed of an inner wall which faces an inner surface of the ejection rod, outer sections facing the outer surface of the ejection rod, and a cantilever-like resilient extension provided on the same side as the outer wall sections to bias the ejection rod against the inner wall. These inner wall and outer wall sections are spaced a distance apart approximately equal to the thickness of the ejection rod. This arrangement minimizes the dimensions of the guide section and the connector incorporating the ejection mechanism, and also improves the efficiency of the ejection mechanism by providing a tight fit of the ejection rod within the guide section.

4 Claims, 7 Drawing Sheets

EJECTION MECHANISM IN A CARD CONNECTOR

FIELD OF THE INVENTION

The present invention generally relates to the art of electrical connectors and, particularly, to an ejection mechanism in a card connector, which connector is adapted for receiving a "Compact Flash" card (or CF card) such as used for digital cameras.

BACKGROUND OF THE INVENTION

Known card ejection mechanisms typically comprise a metal shell, an ejection rod and an ejection lever. The metal shell is attached to the connector body and covers at least a part of a Compact Flash ("CF") card or other type of memory card inserted in the card connector. The metal shell has a guide section at one side thereof, and the ejection rod is slidably attached within the guide section. The ejection lever is rotatable attached to the metal shell, and is operatively connected to the ejection rod such that the ejection lever is rotated when the ejection rod is pushed. The ejection lever has a card-engagement projection formed on one end thereof to contact one side of the card, permitting ejection of the CF card from the card connector by rotation of the ejection lever.

In conventional card ejection mechanisms, the ejection rod is typically fabricated of plastic and is relatively thick in order to endow the rod with a minimum strength. Also, the guide section must allow for clearance of the plastic rod which will generally be fabricated with a relatively wide tolerance range. Accordingly the lateral size of the guide section and ejection rod is relatively large with the result that the width of the card ejection mechanism, and hence the card connector, is increased significantly. In today's trend of down-sizing electronic devices equipped with such card connectors, it is important that these card connectors remain as small as possible. Furthermore, the increased clearance in the guide section to accommodate the plastic ejection rod may actually afford too much clearance in the guide section such that the ejection rod is loose within the guide section. This looseness can cause operating forces to deviate, thus causing an undesired component force to be applied to the metal shell and possibly causing damage or deformation of the shell and certainly increasing the force required to eject a card.

SUMMARY OF THE INVENTION

One object of the present invention is to provide a card ejection mechanism having a guide section having sufficient clearance to allow the ejection rod to pass therethrough smoothly, yet not too much clearance that the rod is loose within the guide section.

To obtain this object, an ejection mechanism is provided in a card connector comprising: a metal shell attached to the connector body, said metal shell having a guide section on one side; an ejection rod slidably attached within the guide section; and an ejection lever rotably attached to the inner surface of the metal shell operatively connected to the ejection rod such that the ejection lever is rotated during sliding of the ejection rod, is improved by: the ejection rod comprises a rectangular metal piece stamped out of a metal sheet; the guide section is composed of an inner wall confronting the inner surface of the ejection rod, outer wall sections confronting the outer surface of the ejection rod, the inner wall and outer wall sections being spaced from each other by the thickness of the ejection rod, and a cantilever-like resilient extension provided on the same side as the outer wall sections to bias the ejection rod against the inner wall.

This construction permits a significant reduction of the lateral size of the card ejection mechanism, and accordingly the lateral size of an electronic device equipped with a card connector having such a card ejection mechanism thereon. The ejection rod is held within the guide section without the looseness found in prior art ejection mechanisms, thus permitting the operating forces to be efficiently transmitted to the ejection rod without deviation.

The rectangular ejection rod includes integral beads longitudinally arranged at intervals on its outer surface which are adapted to abut against the cantilever-like resilient extension of the guide section. The beads substantially increase the strength of the ejection rod without increasing the size of the guide section, and further provides an audible click to a person during actuation of the card ejection mechanism.

The ejection lever has a "U"-shaped joint portion formed on one end thereof to sandwich the ejection rod and the inner wall of the guide section between opposite upright arms of the "U". This connects the ejection lever to the inner wall of the guide section, thereby reducing the looseness of the ejection rod within the guide section to ensure the efficient transmission of operating forces directly to the ejection lever.

Therefore, the stamped and formed ejection rod is relatively thin and made with precision to permit clearance of the ejection rod within the guide section to be minimized. For these reasons the card ejection mechanism can be significantly reduced in width. Furthermore, the ejection rod is spring-biased inwardly by the cantilever-like resilient extension so that it is pushed against the inner wall of the guide section to eliminate the looseness of the ejection rod within the guide section. The integral connection between the ejection rod and the inner wall of the guide section, which connection eliminates the looseness between the ejection rod within the guide section, is assured by the sandwiching of the ejection rod and the inner wall between the opposite upright arms of the "U"-shaped joint portion of the ejection lever.

BRIEF DESCRIPTION OF THE DRAWINGS

Other objects and advantages of the present invention will be understood from the following description of a card ejection mechanism according to the preferred embodiment of the present invention shown in the accompanying drawings.

DESCRIPTION OF THE PREFERRED EMBODIMENT

Figure 1:
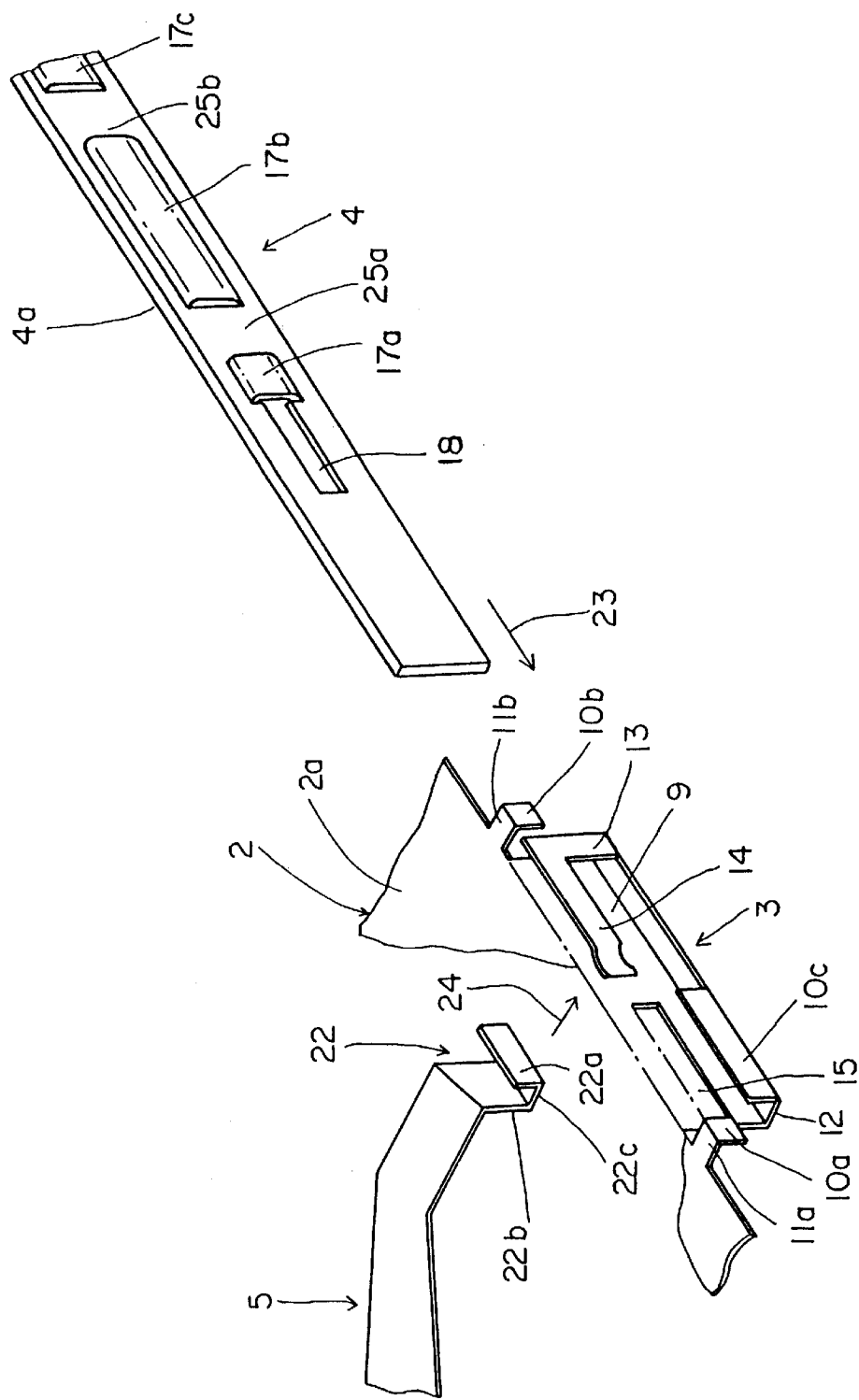
FIG. 1 is an exploded perspective view of the card ejection mechanism of the subject invention.
Figure 2:
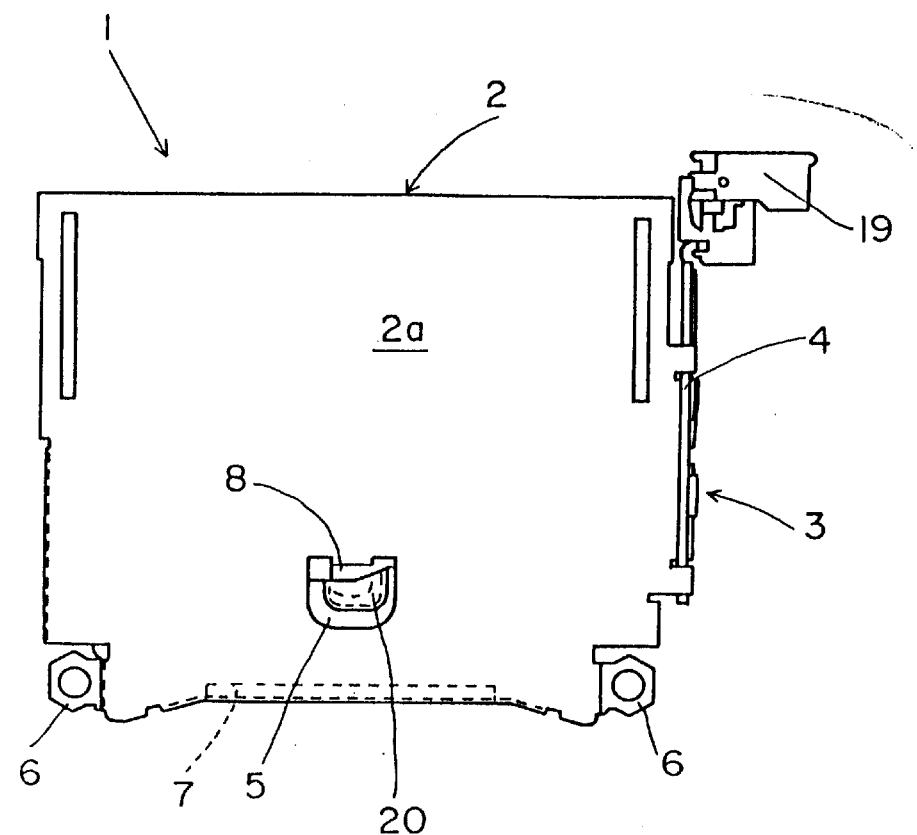
FIG. 2 is a plan view of the card ejection mechanism.
Figure 3:
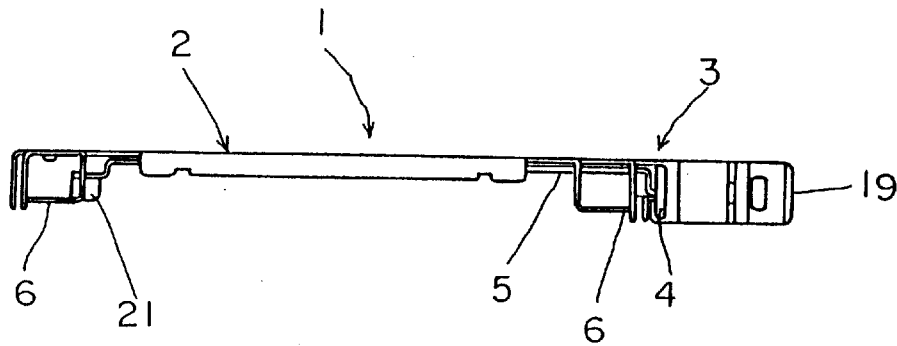
FIG. 3 is a front view of the card ejection mechanism.
Figure 4:
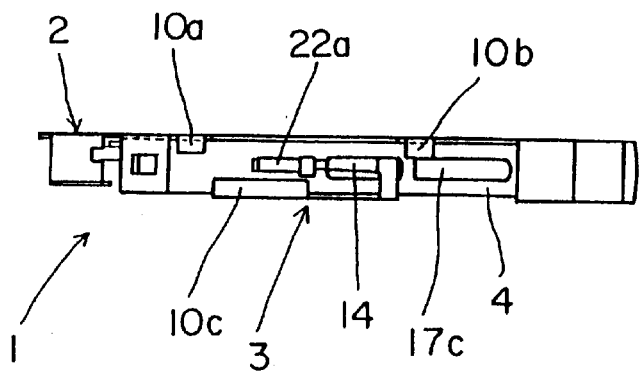
FIG. 4 is a side view of the card ejection mechanism.
Figure 5:
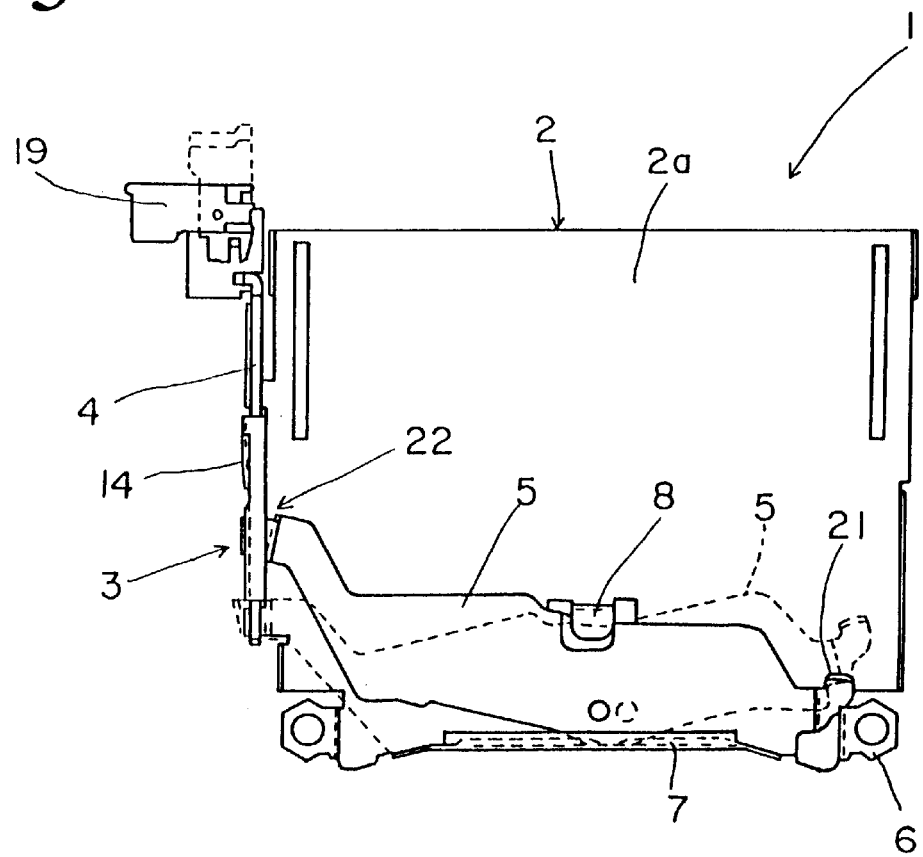
FIG. 5 is a bottom view of the card ejection mechanism.

FIGS. 2 and 5 show an ejection mechanism 1 in a card connector, and FIG. 1 shows a portion of the card ejection mechanism in exploded form. As seen in FIGS. 2 through 5, card ejection mechanism 1 comprises a metal shell 2 having a guide section 3 at one side thereof; an ejection rod 4 slidably movable within the guide section 3; and an ejection lever 5 rotatably attached to an inner surface of metal shell 2, and operatively connected to ejection rod 4 such that ejection lever 5 is rotated in response to actuation of ejection rod 4.

Referring still to FIGS. 2 through 5, a main portion 2a of metal shell 2 has a lateral size or width corresponding to the connector body (not shown), and the front side of main portion 2a (the lower side in FIG. 2) is attached to the connector body by opposite joint pieces 6. A card can be pushed in and ejected from the rear side of main portion 2a (the upper side in FIG. 2). Main portion 2a of metal shell 2 is large enough to cover at least a part of the card.

Main portion of metal shell 2 has a lateral slot 7 formed on its front by bending a section inward, thereby permitting the ejection lever 5 to be partly received therein. A pivot projection 8 is stamped out of a center portion of the main portion, thereby permitting ejection lever 5 to be pivotally attached to the inner surface of main portion 2a. Ejection lever 5 is rotatable on the inner surface of main portion 2a by permitting the center edge of ejection lever 5 to engage pivot projection 8 and by permitting the opposite edge part of ejection lever 5 to be received in lateral slot 7.

Figure 6:
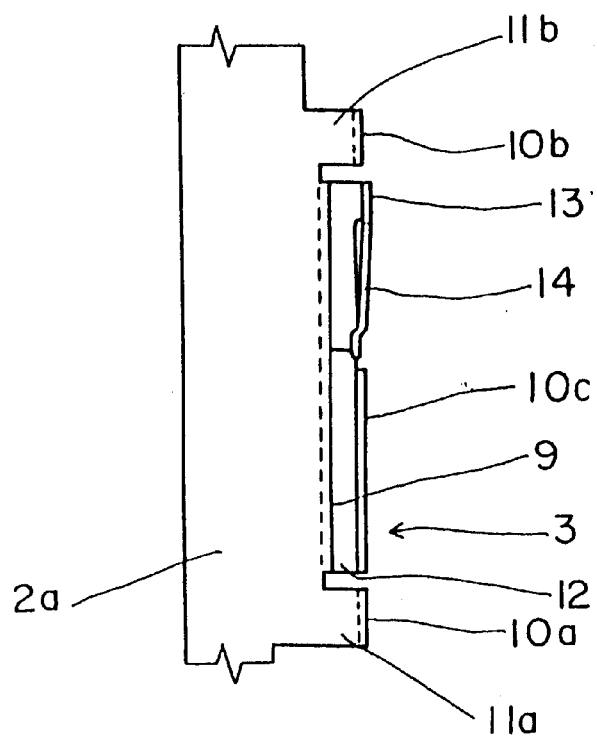
FIG. 6 is an enlarged plan view of the guide section of the card ejection mechanism.
Figure 7:
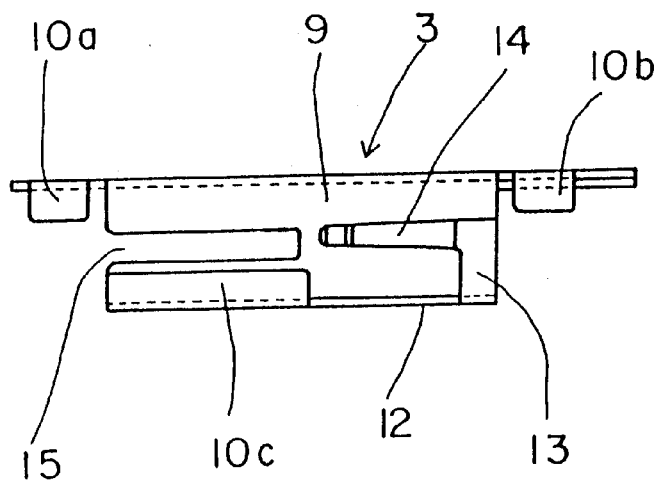
FIG. 7 is a side view of the guide section.

As seen in FIG. 2, guide section 3 is formed on the right side of main portion 2a of metal shell 2. As seen in FIGS. 1, 6 and 7, guide section 3 comprises an inner wall 9 and outer wall sections 10a, 10b and 10c, each being spaced apart from inner wall 9 by a distance equal to the thickness of ejection rod 4. Inner wall 9 extends from the right side of main portion 2a whereas outer wall sections 10a and 10b depend from two lateral extensions from the right side of main portion 2a, and outer wall section 10c extends upwardly from a longitudinal lower edge of a lateral extension of inner wall 9. Additionally, guide section 3 has a cantilever-like resilient piece 14 integrally connected to an upright support 13, which is in turn integrally connected to a lateral extension extending upwardly from a longitudinal lower edge of inner wall 9. Inner wall 9 has a longitudinal engagement slot 15 extending forwardly at the center of the wall and opening at the forward end of the wall. As seen in FIG. 6, cantilever-like resilient piece 14 is bent inwardly.

Figure 8:
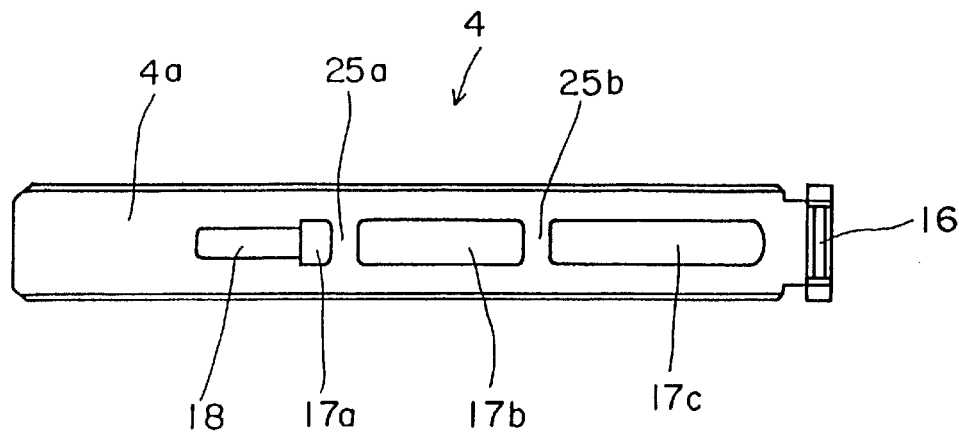
FIG. 8 is a plan view of the ejection rod of the card ejection mechanism.
Figure 9:
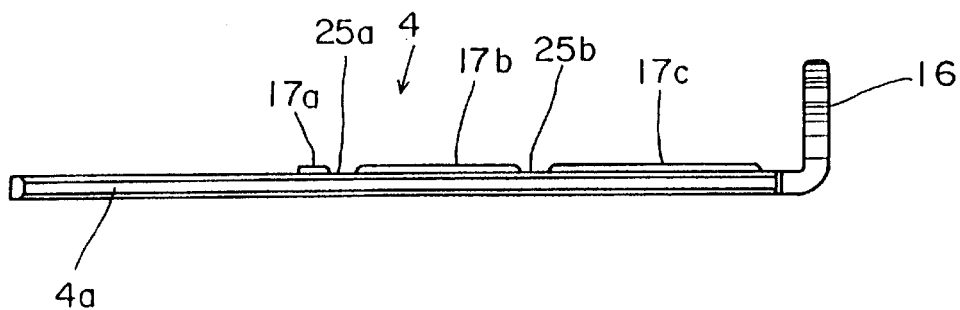
FIG. 9 is a front view of the ejection rod.
Figure 10:
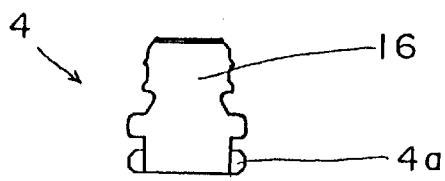
FIG. 10 is a side view of the ejection rod.

Referring to FIGS. 8 through 10, ejection rod 4 is a rectangular metal piece stamped out of a metal sheet, and includes an "L"-shaped joint portion 16 formed at one end thereof. The distance between inner wall 9 and outer wall sections 10a, 10b and 10c is approximately equal to the thickness ("T") of rectangular plate 4a. The rectangular plate 4a has beads 17a, 17b and 17c formed integrally thereon at longitudinal intervals on its outer surface, and an engagement slot 18 formed in front of the first bead 17a. As seen in FIGS. 2 and 5, a flexible thumb push 19 of resin material is attached to the "L"-shaped joint portion 16.

Figure 11:
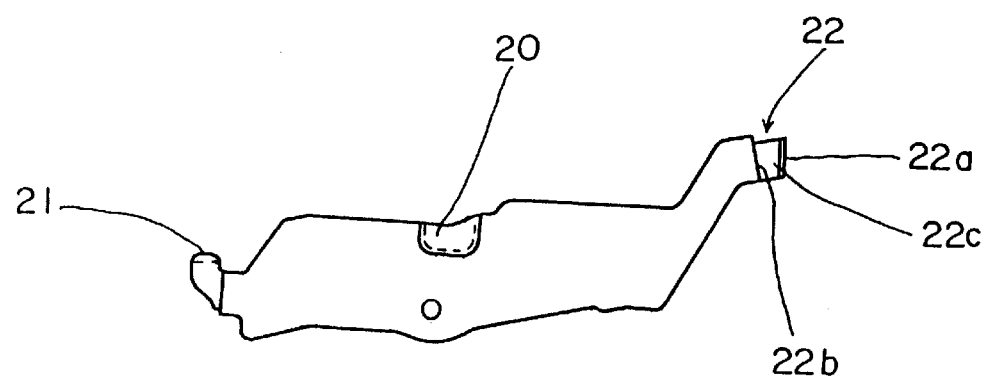
FIG. 11 is a plan view of the ejection lever of the card ejection mechanism.
Figure 12:
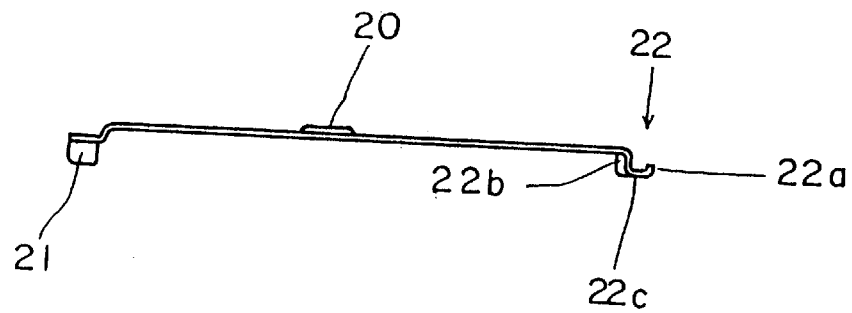
FIG. 12 is a front view of the ejection lever.

Ejection lever 5 is shaped as seen in FIGS. 11 and 12, and is stamped from a metal sheet. The lever includes a bulge portion 20 formed on one edge for engaging pivot projection 8 on main portion 2a of metal shell 2. Ejection lever 5 turns about the pivot projection-and-bulge portion by engaging pivot projection 8 of ejection lever 5 with bulge portion 20 of the ejection lever and by putting the opposite edge part of ejection lever 5 in lateral slot 7 of metal shell 2. Ejection lever 5 turns within the range indicated by the solid and broken lines in FIG. 5.

Ejection lever 5 has a card-engagement piece 21 formed on one end, and a "U"-shaped joint portion 22 formed on the other end. As best seen in FIG. 1, "U"-shaped joint portion 22 comprises an outer, low wall 22a, an inner, tall wall 22b and a horizontally divergent floor 22c. The relatively narrow space between the inner and outer walls is approximately equal to the total thickness of inner wall 9 of guide section 3 and rectangular plate 4a of ejection rod 4. Low wall 22a is shorter than the width of longitudinal engagement slot 15 of inner wall 9 of guide section 3, and the width of longitudinal engagement slot 18 of rectangular plate 4a, thus permitting low wall 22a to pass through these longitudinal engagement slots 15 and 18 to be caught by the outer surface of rectangular plate 4a.

As seen in FIG. 1, rectangular plate 4a of ejection rod 4 is inserted in guide section 3 in the direction indicated by arrow 23, and low wall 22a of joint portion 22 of ejection rod 5 is inserted in longitudinal engagement slots 15 and 18 of guide section 3 and ejection rod 4, as indicated by arrow 24, until low wall 22a of joint portion 22 is caught by rectangular plate 4a of ejection rod 4. The inner surface of rectangular plate 4a faces inner wall 9 of guide section 3 and the outer surface of rectangular plate 4a faces outer wall sections 10a, 10b and 10c.

Ejection rod 4 is relatively thin due to being stamped from a metal sheet, and therefore can be made with relative precision, thus permitting the guide clearance for ejection rod 4 to be reduced to a minimum. Accordingly, guide section 3 includes a correspondingly narrow space since there is no need to increase the clearance for the rectangular plate, as had to be done with the ejection rods used in conventional card ejection mechanisms. As a result, the lateral size of guide section 3, and the overall card connector, can be reduced significantly.

Ejection rod 4 is spring-biased inwardly by the cantilever-like resilient piece 14 of guide section 3, so that rectangular plate 4a may be pushed against inner wall 9 to prevent the looseness of ejection rod 4 within guide section 3. Thus, the entire pushing force is applied directly to ejection lever 5, with no deviating force to be wasted on lateral movement or on deformation of metal shell 2.

The inward-biasing of ejection rod 4 by cantilever-like resilient piece 14 allows the lateral dimension of guide section 3 to be reduced, compared with the outward-biasing of the ejection rod by the cantilever-like resilient piece provided on the side of the inner wall.

Figure 13:
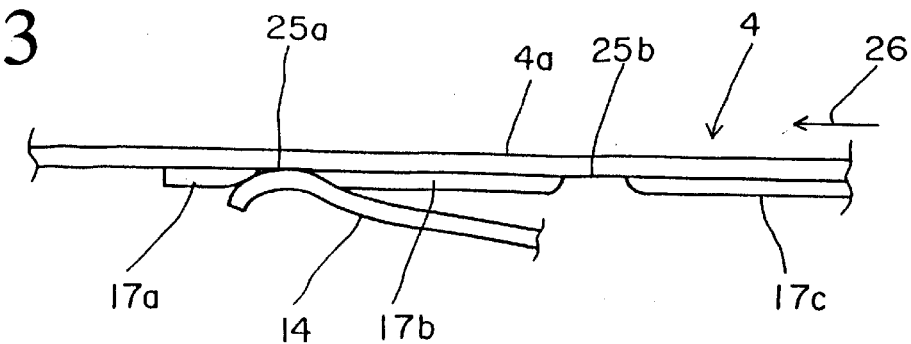
FIG. 13 illustrates how the ejection rod structurally cooperates with the cantilever-like resilient piece.

Beads 17a, 17b and 17c are integrally formed on the outer surface of rectangular plate 4a and are positioned in the space formed on the side of the outer wall sections when rectangular plate 4a is pushed forward. Integral beads 17a, 17b and 17c increase the strength of rectangular plate 4a. Furthermore, the non-continuous arrangement of the beads provides audible feedback in the form of a click caused by moving ejection rod 4 longitudinally. FIG. 13 shows how the space between adjacent beads corresponds to cantilever-like resilient piece 14 in size and position. Specifically, the distance from the first space between bead 17a and bead 17b to the second space between bead 17b and bead 17c is set to be approximately equal to the stroke which is required to move ejection lever 5 from the position indicated by the solid line to the position indicated by the broken line (or vice versa) as shown in FIG. 5. When ejection rod 4 is moved in the direction indicated by arrow 26 in FIG. 13, the free end of cantilever-like resilient piece 14 moves into the second space 25b, and then the audible click is caused, and the ejection lever moves to the position indicated by the broken line in FIG. 5.

Figure 14:
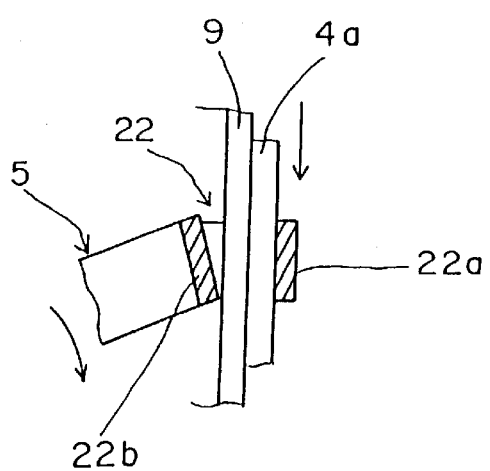
FIG. 14 illustrates how the U-shaped joint portion of the ejection lever structurally cooperates with the ejection rod and the inner wall of the guide section.
Figure 15:
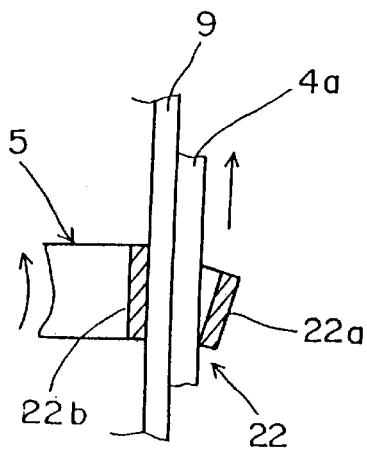
FIG. 15 is a similar illustration showing how the U-shaped joint portion of the ejection lever structurally cooperates with the ejection rod and the inner wall of the guide section.

Referring to FIGS. 14 and 15, "U"-shaped joint portion 22 of ejection lever 5 changes position relative to inner wall 9 and rectangular plate 4a. As seen in these drawings, inner wall 9 and rectangular plate 4a are sandwiched between the opposite low and tall walls 22a and 22b of "U"-shaped joint portion 22. This allows inner wall 9 and rectangular plate 4a to be secured together, in addition to the inward-biasing of rectangular plate 4a to inner wall 9, so that the ejection lever is free of looseness within guide section 3.

As is understood from the above, the lateral size of the guide section is reduced to a minimum, and at the same time, the ejection rod is guaranteed to be free of looseness in the guide section by using a rectangular metal ejection plate and by spring-biasing the ejection plate inwardly by a cantilever-like resilient piece provided on the outer side of the guide section. Accordingly, the card ejection mechanism, and hence the card connector, is reduced significantly in width. Also, the tight fitting of the ejection rod within the guide section allows the operating force to be efficiently transmitted from the ejection rod directly to the ejection lever, thereby assuring efficient functioning of the card ejection mechanism without fear of deforming the metal shell.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. An ejection mechanism for a card connector comprising:
   a stamped metal shell for receiving a card, the metal shell having a guide section at one side thereof,
   a stamped ejection rod slidably mounted within the guide section, the ejection rod having an inner surface, an outer surface and a thickness; and
   a stamped ejection lever rotatable with respect to an inner surface of the metal shell, the ejection lever operatively connected to the ejection rod such that the ejection lever is rotated during sliding of the ejection rod,
   wherein the guide section of the metal shell includes an inner wall facing the inner surface of the ejection rod, outer wall sections facing the outer surface of the ejection rod, wherein the inner wall and outer wall sections are spaced from each other by the thickness of the ejection rod, and a cantilevered extension formed on the guide section and adapted to bias the ejection rod against the inner wall, and
   the ejection rod further includes integrally formed beads longitudinally positioned at intervals along the outer surface, whereby the beads abut against the cantilevered extension of the guide section during sliding of the ejection rod.

2. The ejection mechanism as set forth in claim 1 wherein the ejection lever includes a "U"-shaped joint portion formed on one end thereof to sandwich the ejection rod and the inner wall of the guide section between opposite arms of the "U"-shaped joint portion.

3. The ejection mechanism as set forth in claim 2 wherein the ejection lever includes a card-engagement piece formed on the other end thereof for ejecting the card.

4. An ejection mechanism for a card connector comprising:
   a stamped metal shell for receiving a card, the metal shell having a guide section at one side thereof;
   a stamped ejection rod slidably mounted within the guide section, the ejection rod having an inner surface, an outer surface and a thickness "T"; and
   a stamped ejection lever rotatable with respect to an inner surface of the metal shell, the ejection lever operatively connected to the ejection rod such that the ejection lever is rotated during sliding of the ejection rod,
   wherein the guide section of the metal shell includes an inner wall facing the inner surface of the ejection rod, outer wall sections facing the outer surface of the ejection rod, the inner wall and outer wall sections being spaced from each other by a distance approximately equal to the thickness "T" of the ejection rod, and a cantilevered extension formed on the guide section generally parallel to the outer wall sections and adapted to bias the ejection rod against the inner wall,
   the metal shell further includes a lateral slot formed on a front portion thereof and a pivot projection for receiving the ejection lever therebetween, and
   the ejection lever includes a bulge portion formed on an edge thereof for engaging the pivot projection.

* * * * *